(12) United States Patent
Luo et al.

(10) Patent No.: US 11,404,579 B2
(45) Date of Patent: Aug. 2, 2022

(54) ARRAY SUBSTRATE AND MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Chuanbao Luo, Guangdong (CN); Macai Lu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 187 days.

(21) Appl. No.: 16/645,934

(22) PCT Filed: Jan. 16, 2020

(86) PCT No.: PCT/CN2020/072425
§ 371 (c)(1),
(2) Date: Mar. 10, 2020

(87) PCT Pub. No.: WO2021/138931
PCT Pub. Date: Jul. 15, 2021

(65) Prior Publication Data
US 2021/0408295 A1 Dec. 30, 2021

(30) Foreign Application Priority Data

Jan. 6, 2020 (CN) .......................... 202010008796.0

(51) Int. Cl.
*H01L 29/786* (2006.01)
*H01L 27/12* (2006.01)
(Continued)

(52) U.S. Cl.
CPC ...... *H01L 29/78606* (2013.01); *G02F 1/1368* (2013.01); *G02F 1/13439* (2013.01);
(Continued)

(58) Field of Classification Search
CPC ......... H01L 21/02565; H01L 21/02631; H01L 21/6835; H01L 21/043; H01L 27/1225;
(Continued)

(56) References Cited

U.S. PATENT DOCUMENTS 10,958,446 B2 * 3/2021 Singhi et al. ....... H01L 27/3263
2019/0386083 A1 * 12/2019 Liu ..................... H02L 27/3262

FOREIGN PATENT DOCUMENTS

CN 201711004263 X * 10/2017 ....... H01L 29/69969

* cited by examiner

*Primary Examiner* — Nikolay K Yushin

(57) ABSTRACT

The present disclosure provides an array substrate and a manufacturing method thereof, and a display panel. In the array substrate, a functional layer disposed between an active layer and a gate insulating layer protects the active layer during etching of the active layer, which prevents the active layer from damage and conducts a source/drain layer and the active layer, so that transistors in the array substrate work normally, solving the technical problem that current display panels damage the active layer during a preparation process, which causes performance of thin film transistors to decrease.

14 Claims, 5 Drawing Sheets

(51) Int. Cl.
  *G02F 1/1362* (2006.01)
  *G02F 1/1333* (2006.01)
  *G02F 1/1343* (2006.01)
  *G02F 1/1368* (2006.01)
  *H01L 21/02* (2006.01)
  *H01L 29/66* (2006.01)
  *H01L 27/32* (2006.01)

(52) U.S. Cl.
  CPC .. *G02F 1/133345* (2013.01); *G02F 1/136209* (2013.01); *G02F 1/136222* (2021.01); *G02F 1/136227* (2013.01); *H01L 21/02565* (2013.01); *H01L 21/02631* (2013.01); *H01L 27/124* (2013.01); *H01L 27/127* (2013.01); *H01L 27/1225* (2013.01); *H01L 29/66969* (2013.01); *H01L 29/7869* (2013.01); *H01L 29/78633* (2013.01); *H01L 27/3262* (2013.01); *H01L 27/3272* (2013.01); *H01L 27/3276* (2013.01)

(58) Field of Classification Search
  CPC . H01L 27/124; H01L 27/127; H01L 27/3262; H01L 27/3272; H01L 27/3276; H01L 29/78606; H01L 29/66969; H01L 29/78633; H01L 29/7869; G02F 1/136222; G02F 1/133345; G02F 1/13439; G02F 1/136209; G02F 1/136227; G02F 1/1368
  See application file for complete search history.

ARRAY SUBSTRATE AND MANUFACTURING METHOD THEREOF, AND DISPLAY PANEL

FIELD OF INVENTION

The present disclosure relates to the display technology field, and more particularly, to an array substrate and a manufacturing method thereof, and a display panel.

BACKGROUND OF INVENTION

Current top gate type indium gallium zinc oxide (IGZO) thin film transistors are widely applied in display panels thanks to advantages such as only requiring a small number of masks due to small parasitic capacitance, having other film layers that protect IGZO, etc. However, during a preparation process of the display panels, an increase in oxygen vacancy defect state of the IGZO layer after a yellow light process and a stripping process will occur, resulting in decreased performance of IGZO thin film transistors. Meanwhile, a photoresist stripping solution will have an etching effect on IGZO, which further decreases the performance of IGZO thin film transistors.

Therefore, current display panels have a technical problem of damaging an active layer during the preparation process, which causes the performance of IGZO thin film transistors to decrease.

SUMMARY OF INVENTION

The present disclosure provides an array substrate and a manufacturing method thereof, and a display panel to solve the technical problems that the current display panel damages the active layer during the preparation process, which causes the performance of IGZO thin film transistors to decrease.

In order to solve the above problems, the present disclosure provides technical solutions as follows.

The present disclosure provides an array substrate comprising a substrate, a buffer layer disposed at one side of the substrate, an active layer disposed on the buffer layer in a direction that is away from the substrate, a functional layer disposed on the active layer in a direction that is away from the buffer layer, a gate insulating layer disposed on the functional layer in a direction that is away from the active layer, a gate layer disposed on the gate insulating layer in a direction that is away from the functional layer, an interlayer insulating layer disposed on the gate layer in a direction that is away from the gate insulating layer, a source/drain layer disposed on the interlayer insulating layer in a direction that is away from the gate layer, a passivation layer disposed on the source/drain layer in a direction that is away from the interlayer insulating layer, and a pixel electrode layer disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer.

In some embodiments, a projection area of the functional layer on the substrate is equal to or less than a projection area of the active layer on the substrate.

In some embodiments, a material of the active layer comprises one of indium gallium zinc oxide, indium gallium zinc tin oxide, zinc tin oxide, or indium zinc oxide.

In some embodiments, a material of the functional layer comprises a metal oxide, and the metal oxide comprises at least one of indium gallium tin oxide, indium tin oxide, or indium zinc oxide.

In some embodiments, a thickness of the functional layer ranges from 50 Å to 100 Å.

In some embodiments, the functional layer comprises conductive portions and an insulating portion, the insulating portion is disposed between the conductive portions, and the source/drain layer is connected to the conductive portions through the first through-hole.

In some embodiments, the functional layer comprises conductive portions and a semiconductor portion, the semiconductor portion is disposed between the conductive portions, and the source/drain layer is connected to the conductive portions through the first through-hole.

In some embodiments, the array substrate comprises a light-shielding layer, the light-shielding layer is disposed between the substrate and the buffer layer, a second through-hole is formed on the interlayer insulating layer, a third through-hole is formed on the buffer layer, and the source/drain layer is connected to the light-shielding layer through the second through-hole and the third through-hole.

In some embodiments, the array substrate comprises a color resist layer and a protecting layer, the color resist layer is disposed on the passivation layer, and the protecting layer is disposed on the color resist layer.

At the same time, an embodiment of the present disclosure provides a manufacturing method of an array substrate comprising providing a substrate; forming a light-shielding layer on the substrate, and etching the light-shielding layer to form a light-shielding pattern; forming a buffer layer on the light-shielding layer; forming an active layer disposed on the buffer layer; forming a functional layer disposed on the active layer; etching the active layer and the functional layer to form an active layer pattern and a functional layer pattern; forming a gate insulating layer on the functional layer, and etching the gate insulating layer to form a gate insulating layer pattern; forming a gate layer disposed on the gate insulating layer, and etching the gate layer to form a gate layer pattern; forming an interlayer insulating layer on the gate layer, digging the interlayer insulating layer to form a first through-hole and a second through-hole, and digging the buffer layer to form a third through-hole; forming a source/drain layer on the interlayer insulating layer, and etching the source/drain layer to form a source/drain layer pattern, wherein the source/drain layer is connected to the functional layer through the first through-hole, the functional layer is used for conducting the source/drain layer and the active layer, and the source/drain layer is connected to the light-shielding layer through the second through-hole and the third through-hole; forming a passivation layer on the source/drain layer, and etching the passivation layer to form a passivation layer pattern; and forming a pixel electrode layer on the passivation layer, and etching the pixel electrode layer to form a pixel electrode layer pattern.

In some embodiments, the step of forming the functional layer on the active layer comprises depositing a metal oxide on the active layer by physical vapor deposition to form the functional layer, and controlling an argon/oxygen ratio in a gas range from 2 to 4.

In some embodiments, the step of etching the active layer and the functional layer to form the active layer pattern and the functional layer pattern comprises etching the active layer and the functional layer at the same time by a photolithography process to form the active layer pattern and the functional layer pattern.

At the same time, the present disclosure provides a display panel, and the display panel comprises an array substrate. The array substrate comprises a substrate, a buffer layer disposed at one side of the substrate, an active layer disposed on the buffer layer in a direction that is away from the substrate, a functional layer disposed on the active layer in a direction that is away from the buffer layer, a gate insulating layer disposed on the functional layer in a direction that is away from the active layer, a gate layer disposed on the gate insulating layer in a direction that is away from the functional layer, an interlayer insulating layer disposed on the gate layer in a direction that is away from the gate insulating layer, a source/drain layer disposed on the interlayer insulating layer in a direction that is away from the gate layer, a passivation layer disposed on the source/drain layer in a direction that is away from the interlayer insulating layer, and a pixel electrode layer disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer, wherein a first through-hole is formed on the interlayer insulating layer, the source/drain layer is connected to the functional layer through the first through-hole, and the functional layer is used for conducting the source/drain layer and the active layer.

In some embodiments, the display panel comprises an organic light-emitting diode (OLED) display panel, and the OLED display panel comprises a pixel definition layer, a light-emitting layer, a common electrode, and an encapsulation layer.

In some embodiments, the display panel comprises a liquid crystal display panel, and the liquid crystal display panel comprises a color film substrate and a liquid crystal cell located between the array substrate and the color film substrate.

In some embodiments, a projection area of the functional layer on the substrate is equal to or less than a projection area of the active layer on the substrate.

In some embodiments, a material of the active layer comprises one of indium gallium zinc oxide, indium gallium zinc tin oxide, zinc tin oxide, or indium zinc oxide.

In some embodiments, a material of the functional layer comprises a metal oxide, and the metal oxide comprises at least one of indium gallium tin oxide, indium tin oxide, or indium zinc oxide.

In some embodiments, a thickness of the functional layer ranges from 50 Å to 100 Å.

In some embodiments, the functional layer comprises conductive portions and an insulating portion, the insulating portion is disposed between the conductive portions, and the source/drain layer is connected to the conductive portions through the first through-hole.

The embodiments of the present disclosure provide an array substrate and a manufacturing method thereof, and a display panel. The array substrate comprises a substrate, a buffer layer, an active layer, a functional layer, a gate insulating layer, a gate layer, an interlayer insulating layer, a source/drain layer, a passivation layer, and a pixel electrode layer. The buffer layer is disposed at one side of the substrate, the active layer is disposed on the buffer layer in a direction that is away from the substrate, the functional layer is disposed on the active layer in a direction that is away from the buffer layer, the gate insulating layer is disposed on the functional layer in a direction that is away from the active layer, the gate layer is disposed on the gate insulating layer in a direction that is away from the functional layer, the interlayer insulating layer is disposed on the gate layer in a direction that is away from the gate insulating layer, the source/drain layer is disposed on the interlayer insulating layer in a direction that is away from the gate layer, the passivation layer is disposed on the source/drain layer in a direction that is away from the interlayer insulating layer, and the pixel electrode layer is disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer. The functional layer is disposed between the active layer and the gate insulating layer, so that when the active layer is etched, the active layer is protected without damaging a surface of the active layer, thereby preventing the active layer from damage, and the functional layer may conduct the source/drain layer and the active layer, so that the transistors in the array substrate work normally, solving the technical problem that current display panels damage the active layer during the preparation process, which causes the performance of thin film transistors to decrease.

DETAILED DESCRIPTION OF PREFERRED EMBODIMENTS

The present disclosure provides an array substrate and a manufacturing method thereof, and a display panel. In order to make purposes, technical solutions, and effects of the present disclosure clearer and more definite, the following further describes the present disclosure in detail with reference to the drawings and embodiments. It should be understood that the specific embodiments described herein are only used to explain the present disclosure, and are not intended to limit the present disclosure.

Embodiments of the present disclosure are directed to the technical problems that the current display panel damages the active layer during the preparation process, which causes the performance of thin film transistors to decrease, and the embodiments of the present disclosure are used for solving the technical problems.

Figure 1:
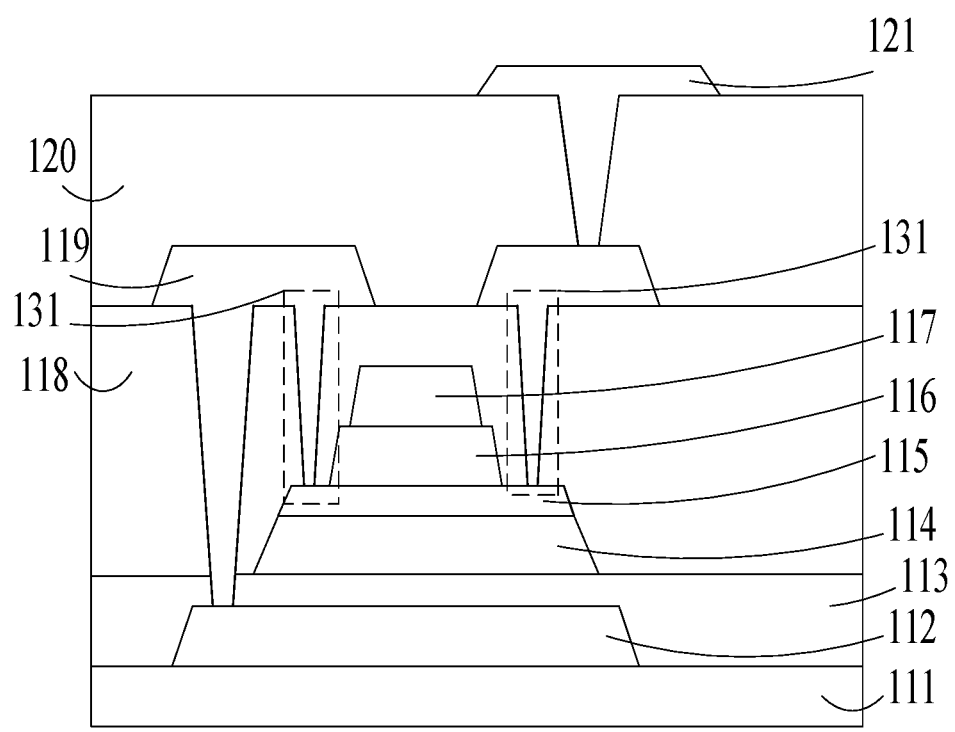
FIG. 1 is a schematic diagram of an array substrate provided by an embodiment of the present disclosure.

As shown in FIG. 1, an embodiment of the present disclosure provides an array substrate. The array substrate comprises a substrate 111, a buffer layer 113 disposed at one side of the substrate 111, an active layer 114 disposed on the buffer layer 113 in a direction that is away from the substrate 111, a functional layer 115 disposed on the active layer 114 in a direction that is away from the buffer layer 113, a gate insulating layer 116 disposed on the functional layer 115 in a direction that is away from the active layer 114, a gate layer 117 disposed on the gate insulating layer 116 in a direction that is away from the functional layer 115, an interlayer insulating layer 118 disposed on the gate layer 117 in a direction that is away from the gate insulating layer 116, a source/drain layer 119 disposed on the interlayer insulating layer 118 in a direction that is away from the gate layer 117, a passivation layer 120 disposed on the source/drain layer 119 in a direction that is away from the interlayer insulating layer 118, and a pixel electrode layer 121 disposed on the passivation layer 120 in a direction that is away from the source/drain layer 119, wherein a first through-hole 131 is formed on the interlayer insulating layer 118, the source/drain layer 119 is connected to the functional layer 115 through the first through-hole 131, and the functional layer 115 is used for conducting the source/drain layer 119 and the active layer 114.

The embodiment of the present disclosure provides the array substrate. The array substrate comprises the substrate, the buffer layer, the active layer, the functional layer, the gate insulating layer, the gate layer, the interlayer insulating layer, the source/drain layer, the passivation layer, and the pixel electrode layer. The buffer layer is disposed at one side of the substrate, the active layer is disposed the buffer layer on in a direction that is away from the substrate, the functional layer is disposed on the active layer in a direction that is away from the buffer layer, the gate insulating layer is disposed on the functional layer in a direction that is away from the active layer, the gate layer is disposed on the gate insulating layer in a direction that is away from the functional layer, the interlayer insulating layer is disposed on the gate layer in a direction that is away from the gate insulating layer, the source/drain layer is disposed on the interlayer insulating layer in a direction that is away from the gate layer, the passivation layer is disposed on the source/drain layer in a direction that is away from the interlayer insulating layer, and the pixel electrode layer is disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer. The functional layer is disposed between the active layer and the gate insulating layer, so that when the active layer is etched, the active layer is protected without damaging a surface of the active layer, thereby preventing the active layer from damage, and the functional layer may conduct the source/drain layer and the active layer, so that the transistors in the array substrate work normally, solving the technical problem that the current display panels damage the active layer during the preparation process, which causes the performance of thin film transistors to decrease.

In one embodiment, as shown in FIG. 1, a projection area of the functional layer 115 on the substrate 111 is equal to or less than a projection area of the active layer 114 on the substrate 111. The functional layer is disposed on the active layer, so that the functional layer protects the active layer and prevents an etching solution from eroding the active layer, therefore, there are no defects in the active layer, and the performance of transistors in the array substrate is improved. An area of the functional layer is less than or equal to an area of the active layer, so that the functional layer does not exceed the active layer, thereby shielding other areas. When the area of the functional layer is less than the area of the active layer, as shown in FIG. 1, the functional layer and the active layer are trapezoidal. While the functional layer may protect the surface of the active layer, the functional layer will not exceed the active layer.

In one embodiment, a material of the active layer comprises one of indium gallium zinc oxide, indium gallium zinc tin oxide, zinc tin oxide, or indium zinc oxide. For the array substrate adopting a metal oxide as the active layer, during the preparation process, the metal oxide may be etched by an etching solution or a stripping solution, and the functional layer is formed on the metal oxide, so that the functional layer may protect the metal oxide, thereby improving the performance of metal oxide thin film transistors.

In one embodiment, a material of the functional layer comprises a metal oxide, and the metal oxide comprises at least one of indium gallium tin oxide, indium tin oxide, or indium zinc oxide. When the functional layer is disposed on the active layer, it can be considered that on the basis of protecting the active layer, an electron concentration of the active layer can be further increased, thereby improving the mobility of the metal oxide thin film transistor, which improves the performance of metal oxide thin film transistors. The functional layer is formed by the metal oxide such as indium tin oxide, etc., so that the functional layer increases the electron concentration in the active layer, thereby improving the mobility of metal oxide thin film transistors. Because the mobility of the current IGZO is limited by the material, it is approximately 10 cm$^2$/Vs to 12 cm$^2$/Vs, that is, 10 cm$^2$/(volts/second) to 12 cm$^2$/(volts/second), so that the metal oxide thin film transistors cannot be applied in thin film transistor applications that require higher mobility, such as a sensor field. In the present disclosure, the functional layer improves the mobility of metal oxide thin film transistors, so that the metal oxide thin film transistors can be applied in more fields, such as the sensor field.

In one embodiment, a thickness of the functional layer is less than a thickness of the active layer. When preparing the active layer, the thickness of the functional layer is less than the thickness the active layer, the functional layer does not increase a thickness of the array substrate, and the thickness of the functional layer is sufficient to protect the active layer. Moreover, this prevents a greater thickness of the functional layer, which causes the functional layer to directly become a conductive film layer that directly connects a source and a drain and makes the thin film transistors ineffective.

In one embodiment, the thickness of the functional layer ranges from 50 Å to 100 Å. The thickness of the functional layer should not be too thick or too thin, and the thickness of the functional layer ranges from 50 Å to 100 Å, so that the functional layer can protect the active layer, while the functional layer does not directly conduct the source and the drain, and the functional layer has a small influence on the thickness of the array substrate.

In one embodiment, the functional layer comprises conductive portions and an insulating portion. The insulating portion is disposed between the conductive portions, and the source/drain layer is connected to the conductive portions through the first through-hole. When preparing the functional layer, the functional layer is divided into a plurality of regions, the regions with the source/drain layer forms the conductive portions, so that the source/drain layer can directly connect the active layer through the conductive portions, while the insulating portion is disposed between the conductive portions, so that the source and the drain cannot be connected, and the thin film transistors work normally.

In one embodiment, the functional layer comprises conductive portions and a semiconductor portion, the semiconductor portion is disposed between the conductive portions, and the source/drain layer is connected to the conductive portions through the first through-hole, so that the source/drain layer is connected to the active layer, while the semiconductor portion prevents the source and the drain from connection and separates the source and the drain, and the semiconductor portion adopts a metal oxide material, which improves the electron concentration of the active layer, thereby increasing the mobility of the active layer and the performance of the active layer.

In one embodiment, as shown in FIG. 1, the array substrate comprises a light-shielding layer 112, the light-shielding layer 112 is disposed between the substrate 111 and the buffer layer 113, a second through-hole (not shown in FIG. 1) is formed on the interlayer insulating layer 118, a third through-hole (not shown in FIG. 1) is formed on the buffer layer 113, and the source/drain layer 119 is connected to the light-shielding layer 112 through the second through-hole and the third through-hole.

In one embodiment, the array substrate further comprises a color resist layer and a protecting layer, the color resist layer is disposed on the passivation layer, and the protecting layer is disposed on the color resist layer. For the array substrate with the color resist layer, the functional layer can also be disposed on the active layer to protect the active layer and improve the performance of the active layer.

In one embodiment, the substrate comprises a glass substrate, and a material of the substrate comprises polyimide.

In one embodiment, a material of the light-shielding layer comprises molybdenum.

In one embodiment, the light-shielding layer comprises a stack of copper and molybdenum.

In one embodiment, a material of the second metal layer comprises copper and molybdenum.

In one embodiment, the second metal layer comprises a stack of copper and molybdenum.

In one embodiment, a material of the passivation layer comprises SiNx (silicon nitride) and SiO$_2$ (silicon oxide).

In one embodiment, the passivation layer comprises a stack of silicon nitride and silicon oxide.

In one embodiment, a material of the pixel electrode layer comprises indium tin oxide.

Figure 2:
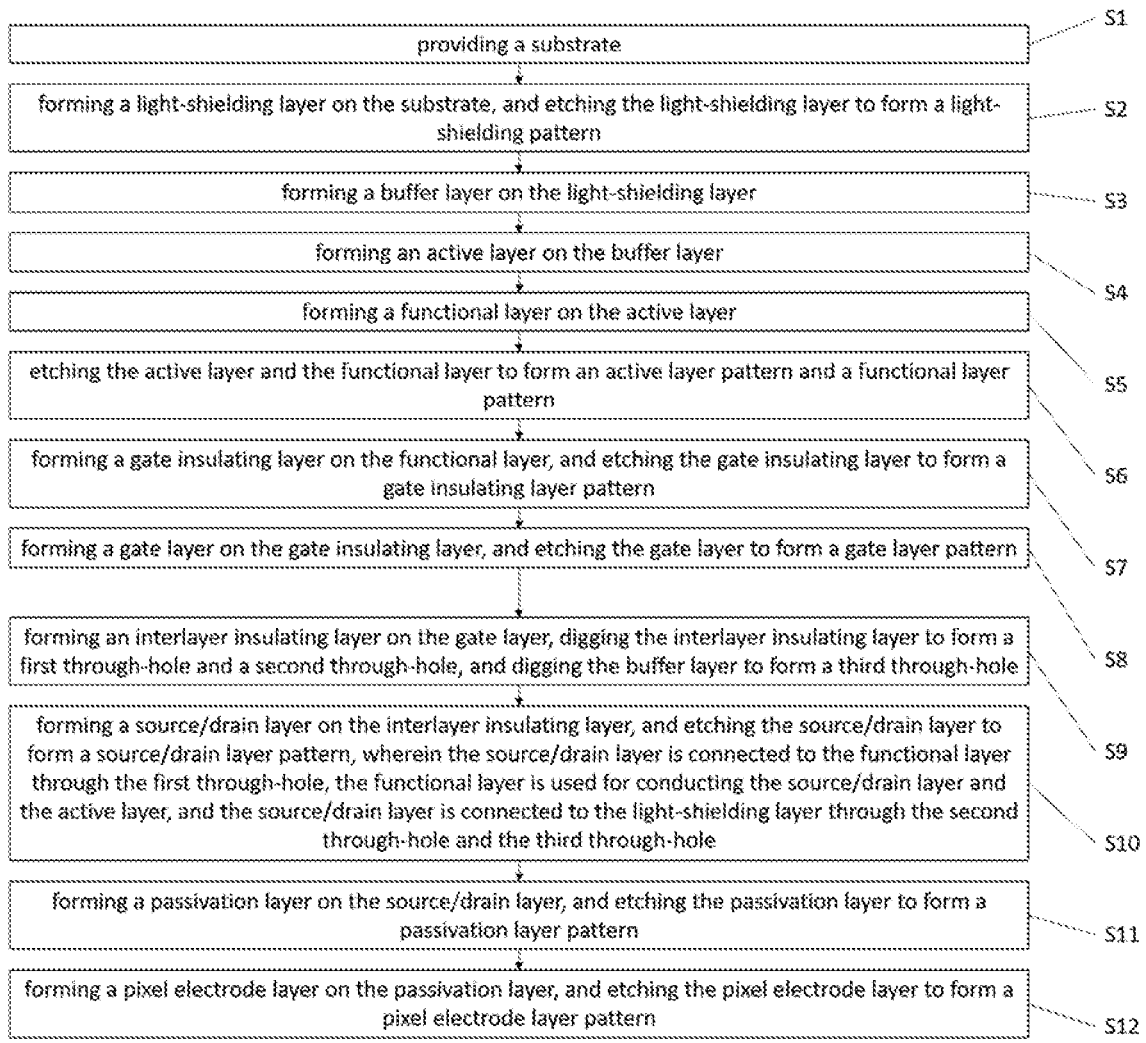
FIG. 2 is a flowchart of a manufacturing method of the array substrate provided by the embodiment of the present disclosure.

As shown in FIG. 2, an embodiment of the present disclosure provides a manufacturing method of an array substrate, the manufacturing method of the array substrate comprises:

Step S1: providing a substrate.

Step S2: forming a light-shielding layer on the substrate, and etching the light-shielding layer to form a light-shielding pattern.

Step S3: forming a buffer layer on the light-shielding layer.

Step S4: forming an active layer disposed on the buffer layer.

Step S5: forming a functional layer disposed on the active layer.

Step S6: etching the active layer and the functional layer to form an active layer pattern and a functional layer pattern.

Step S7: forming a gate insulating layer on the functional layer, and etching the gate insulating layer to form a gate insulating layer pattern.

Step S8: forming a gate layer disposed on the gate insulating layer, and etching the gate layer to form a gate layer pattern.

Step S9: forming an interlayer insulating layer on the gate layer, digging the interlayer insulating layer to form a first through-hole and a second through-hole, and digging the buffer layer to form a third through-hole.

Step S10: forming a source/drain layer on the interlayer insulating layer, and etching the source/drain layer to form a source/drain layer pattern, wherein the source/drain layer is connected to the functional layer through the first through-hole, the functional layer is used for conducting the source/drain layer and the active layer, and the source/drain layer is connected to the light-shielding layer through the second through-hole and the third through-hole.

Step S11: forming a passivation layer on the source/drain layer, and etching the passivation layer to form a passivation layer pattern.

Step S12: forming a pixel electrode layer on the passivation layer, and etching the pixel electrode layer to form a pixel electrode layer pattern.

The embodiment of the present disclosure provides the manufacturing method of the array substrate, and the array substrate formed by the manufacturing method of the array substrate comprises the substrate, the buffer layer, the active layer, the functional layer, the gate insulating layer, the gate layer, the interlayer insulating layer, the source/drain layer, the passivation layer, and a pixel electrode layer. The buffer layer is disposed at one side of the substrate, the active layer is disposed on the buffer layer in a direction that is away from the substrate, the functional layer is disposed on the active layer in a direction that is away from the buffer layer, the gate insulating layer is disposed on the functional layer in a direction that is away from the active layer, the gate layer is disposed on the gate insulating layer in a direction that is away from the functional layer, the interlayer insulating layer is disposed on the gate layer in a direction that is away from the gate insulating layer, the source/drain layer is disposed on the interlayer insulating layer in a direction that is away from the gate layer, the passivation layer is disposed on the source/drain layer in a direction that is away from the interlayer insulating layer, and the pixel electrode layer is disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer. The functional layer is disposed between the active layer and the gate insulating layer, so that when the active layer is etched, the active layer is protected without damaging a surface of the active layer, thereby preventing the active layer from damage, and the functional layer may conduct the source/drain layer and the active layer, so that the transistors in the array substrate work normally, solving the technical problem that the current display panels damage the active layer during the preparation process, which causes the performance of thin film transistors to decrease.

In one embodiment, the step of etching the active layer and the functional layer to form the active layer pattern and the functional layer pattern comprises simultaneously performing etching to the active layer and the functional layer to form the active layer pattern and the functional layer pattern, and during forming the active layer pattern and the functional layer pattern, the active layer pattern and the functional layer pattern are simultaneously formed, so that during the preparation process of the array substrate, there is no need to increase processes and the array substrate preparation process. Moreover, the prepared functional layer pattern can better cover the active layer pattern and protect the active layer.

In one embodiment, the step of forming the functional layer on the active layer comprises: forming conductive portions on the active layer; and forming an insulating portion between the conductive portions to form the functional layer. The functional layer is obtained by using the conductive portions and the insulating portion, so that the source/drain layer is connected to the active layer through the conductive portion. In subsequent etching of the active layer and the functional layer, the active layer and the conductive layer of the functional layer are directly etched to obtain the active layer pattern and the functional layer pattern.

In one embodiment, the step of forming the functional layer on the active layer comprises: forming conductive portions on the active layer; and forming a semiconductor portion between the conductive portions to form the functional layer.

In one embodiment, the step of forming the light-shielding layer on the substrate comprises: depositing metal on the substrate by a physical vapor process sputtering to form the light-shielding layer, and performing a photolithography process on the light-shielding layer to form the light-shielding layer pattern. During performing the photolithography process on the light-shielding layer, hydrogen peroxide can be used as an etchant.

In one embodiment, the step of forming the buffer layer on the light-shielding layer comprises: forming the buffer layer on the light-shielding layer by chemical vapor deposition, and performing high temperature thermal annealing on the buffer layer.

In one embodiment, the step of forming the active layer on the buffer layer comprises: depositing metal oxide on the buffer layer by physical vapor deposition to form the active layer.

In one embodiment, the step of forming the functional layer on the active layer comprises: depositing metal oxide on the active layer by physical vapor deposition to form the functional layer, and controlling an argon/oxygen ratio in a gas range from 2 to 4.

In one embodiment, the step of etching the active layer and the functional layer to form the active layer pattern and the functional layer pattern comprises: etching the active layer and the functional layer at the same time by the photolithography process to form the active layer pattern and the functional layer pattern. Wet etching may be adopted to form the active layer pattern and functional layer pattern and an oxalic acid-based agent may be used as an etchant.

In one embodiment, the step of forming the gate insulating layer on the functional layer comprises: forming the buffer layer on the gate insulating layer by chemical vapor deposition, and performing the photolithography process on the gate insulating layer to form a gate insulating layer pattern.

In one embodiment, after the step of forming the gate layer on the gate insulating layer further comprises: performing a plasma treatment on the active layer.

In one embodiment, the step of forming the interlayer insulating layer on the gate layer comprises: forming the interlayer insulating layer by chemical vapor deposition, performing the photolithography process on the interlayer insulating layer to form the first through-hole and the second through-hole, performing the photolithography process on the buffer layer to form the third through-hole, and forming the first through-hole, the second through-hole and the third through-hole by dry etching with a fluorine-based oxidizing gas.

In one embodiment, the step of forming the source/drain layer on the interlayer insulating layer comprises: forming the source/drain layer on the interlayer insulating layer by physical vapor deposition, performing the photolithography process on the source/drain layer to form the source/drain layer pattern, and using a hydrogen peroxide solution as an etchant.

In one embodiment, the step of forming the passivation layer on the source/drain layer comprises: forming the passivation layer by chemical vapor deposition, performing the photolithography process on the passivation layer to form the passivation layer pattern, and using a fluorine-based gas as a dry etchant.

In one embodiment, the step of forming the pixel electrode layer on the passivation layer comprises: forming the pixel electrode layer by physical vapor deposition, performing the photolithography process on the pixel electrode layer to form the pixel electrode layer pattern, and using the oxalic acid solution as an etchant.

Figure 3:
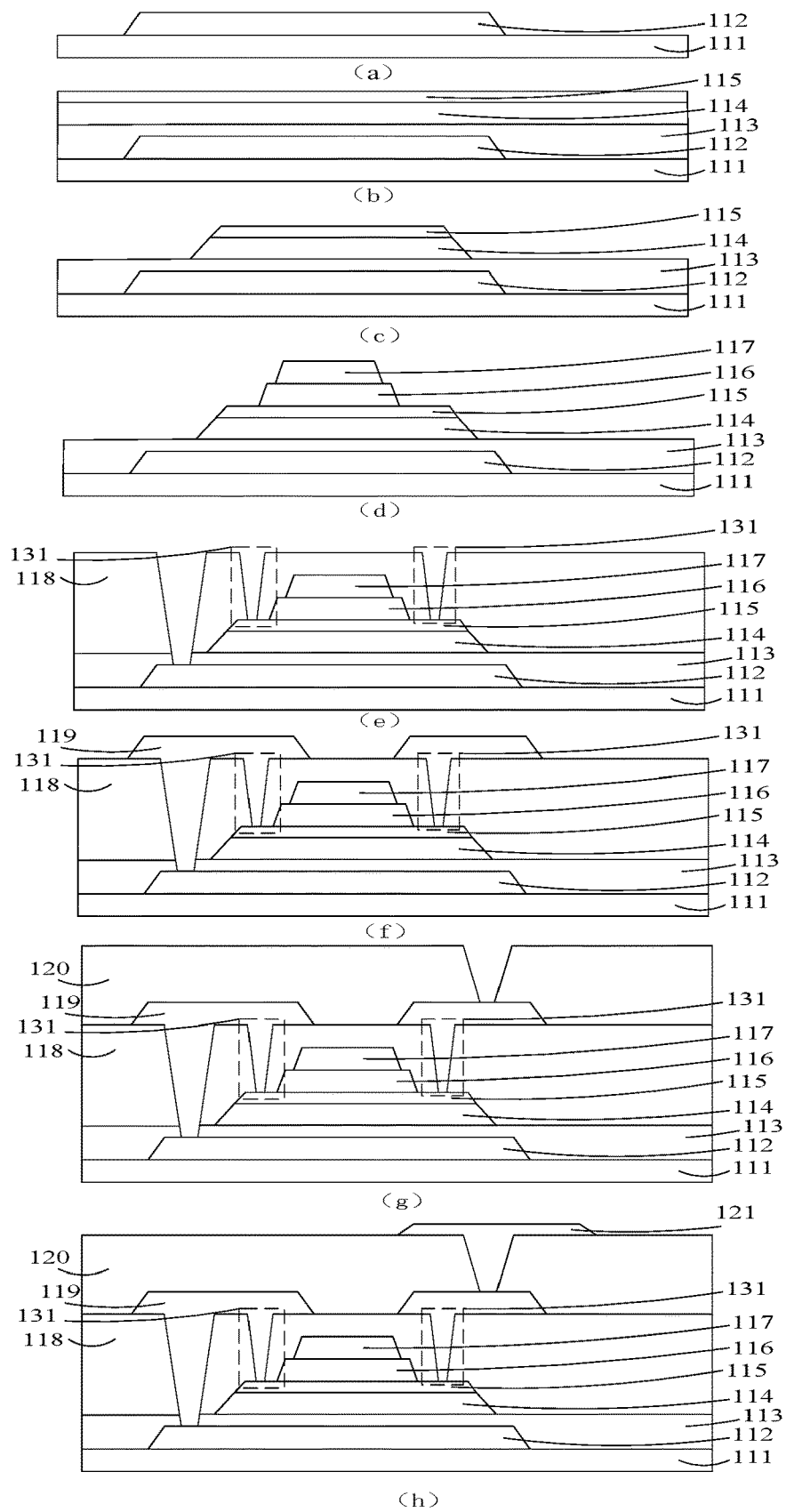
FIG. 3 is schematic diagram of film layers of the array substrate corresponding to each process of the manufacturing method of the array substrate provided by the embodiment of the present disclosure.

As shown in FIG. 3, which is a schematic diagram of film layers of the array substrate corresponding to each process of the manufacturing method of the array substrate provided by the embodiment of the present disclosure, (a) in FIG. 3 is a film layer diagram of the array substrate after etching the light-shielding layer on the array substrate, (b) in FIG. 3 is a film layer diagram of the array substrate after forming the functional layer on the array substrate, (c) in FIG. 3 is a film layer diagram of the array substrate after etching the active layer and the functional layer on the array substrate, (d) in FIG. 3 is a film layer diagram of the array substrate after etching the gate layer and the gate insulating layer on the array substrate, (e) in FIG. 3 is a film layer diagram of the array substrate after etching the interlayer insulating layer and the buffer layer on the array substrate, (f) in FIG. 3 is a film layer diagram of the array substrate after etching the source/drain layer on the array substrate, (g) in FIG. 3 is a film layer diagram of the array substrate after etching the passivation layer on the array substrate, and (h) in FIG. 3 is a film layer diagram of the array substrate after etching the pixel electrode layer on the array substrate.

Figure 4:
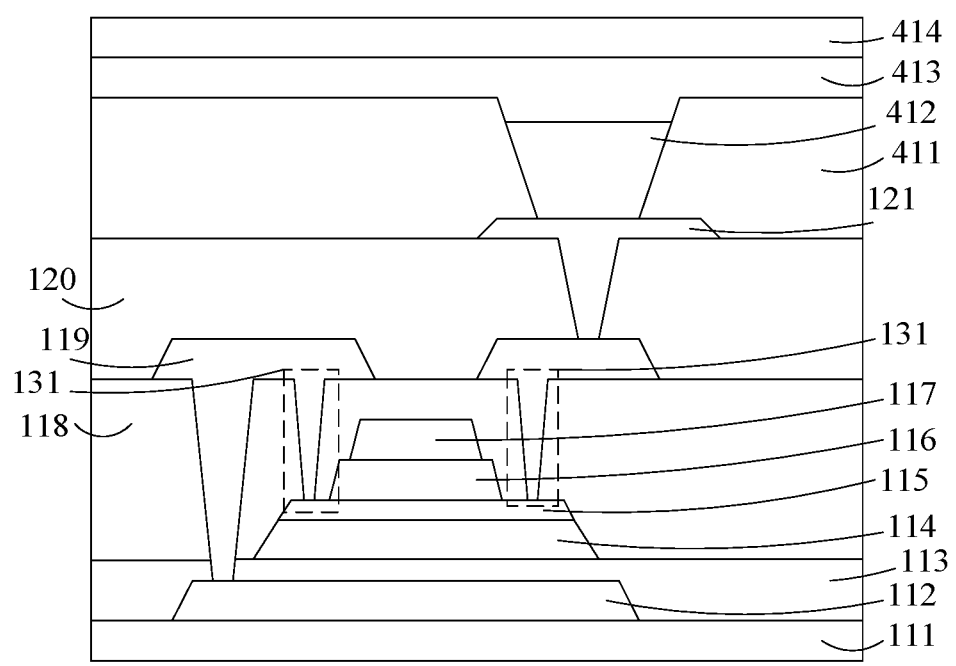
FIG. 4 is a schematic diagram of a display panel provided by the embodiment of the present disclosure.

As shown in FIG. 4, the embodiment of the present disclosure provides a display panel, the display panel comprises an array substrate, and the array substrate comprises a substrate 111, a buffer layer 113 disposed at one side of the substrate 111, an active layer 114 disposed on the buffer layer 113 in a direction that is away from the substrate 111, a functional layer 115 disposed on the active layer 114 in a direction that is away from the buffer layer 113, a gate insulating layer 116 disposed on the functional layer 115 in a direction that is away from the active layer 114, a gate layer 117 disposed on the gate insulating layer 116 in a direction that is away from the functional layer 115, an interlayer insulating layer 118 disposed on the gate layer 117 in a direction that is away from the gate insulating layer 116, a source/drain layer 119 disposed on the interlayer insulating layer 118 in a direction that is away from the gate layer 117, a passivation layer 120 disposed on the source/drain layer 119 in a direction that is away from the interlayer insulating layer 118, and a pixel electrode layer 121 disposed on the passivation layer 120 in a direction that is away from the source/drain layer 119, wherein a first through-hole 131 is formed on the interlayer insulating layer 118, the source/drain layer 119 is connected to the functional layer 115 through the first through-hole 131, and the functional layer 115 is used for conducting the source/drain layer 119 and the active layer 114.

The embodiment of the present disclosure provides the display panel, the display panel comprises the array substrate, and the array substrate comprises the substrate, the buffer layer, the active layer, the functional layer, the gate insulating layer, the gate layer, the interlayer insulating layer, the source/drain layer, the passivation layer, and a pixel electrode layer. The buffer layer is disposed at one side of the substrate, the active layer is disposed on the buffer layer in a direction that is away from the substrate, the functional layer is disposed on the active layer in a direction that is away from the buffer layer, the gate insulating layer is disposed on the functional layer in a direction that is away from the active layer, the gate layer is disposed on the gate insulating layer in a direction that is away from the functional layer, the interlayer insulating layer is disposed on the gate layer in a direction that is away from the gate insulating layer, the source/drain layer is disposed on the interlayer insulating layer in a direction that is away from the gate layer, the passivation layer is disposed on the source/drain layer in a direction that is away from the interlayer insulating layer, and the pixel electrode layer is disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer. The functional layer is disposed between the active layer and the gate insulating layer, so that when the active layer is etched, the active layer is protected without damaging a surface of the active layer, thereby preventing the active layer from damage, and the functional layer may conduct the source/drain layer and the active layer, so that the transistors in the array substrate work normally, solving the technical problem that the current display panels damage the active layer during the preparation process, which causes the performance of thin film transistors to decrease.

In one embodiment, as shown in FIG. 4, the display panel comprises an organic light-emitting diode (OLED) display panel, and the OLED display panel comprises the array substrate according to any one of the above embodiments, a pixel definition layer 411 located above the array substrate, a light-emitting layer 412 located on a pixel region defined by the pixel definition layer 411, a common electrode 413 located on the light-emitting 412, and an encapsulation layer 414 located on the common electrode 413.

In one embodiment, the display panel comprises a liquid crystal display panel, and the liquid crystal display panel comprises the array substrate according to any one of the above embodiments, a color film substrate composed with the array substrate into a cell, and a liquid crystal cell disposed between the array substrate and the color film substrate.

In one embodiment, in the display panel, a projection area of the functional layer on the substrate is equal to or less than a projection area of the active layer on the substrate.

In one embodiment, in the display panel, a material of the active layer comprises one of indium gallium zinc oxide, indium gallium zinc tin oxide, zinc tin oxide, or indium zinc oxide.

In one embodiment, in the display panel, a material of the functional layer comprises a metal oxide, and the metal oxide comprises at least one of indium gallium tin oxide, indium tin oxide, or indium zinc oxide.

In one embodiment, in the display panel, a thickness of the functional layer ranges from 50 Å to 100 Å.

In one embodiment, in the display panel, the functional layer comprises conductive portions and an insulating portion, the insulating portion is disposed between the conductive portions, and the source/drain layer is connected to the conductive portions through the first through-hole.

In one embodiment, in the display panel, the functional layer comprises conductive portions and a semiconductor portion, the semiconductor portion is disposed between the conductive portions, and the source/drain layer is connected to the conductive portions through the first through-hole.

In one embodiment, in the display panel, the array substrate further comprises a light-shielding layer, the light-shielding layer is disposed between the substrate and the buffer layer, a second through-hole is formed on the interlayer insulating layer, a third through-hole is formed on the buffer layer, and the source/drain layer is connected to the light-shielding layer through the second through-hole and the third through-hole.

Figure 5:
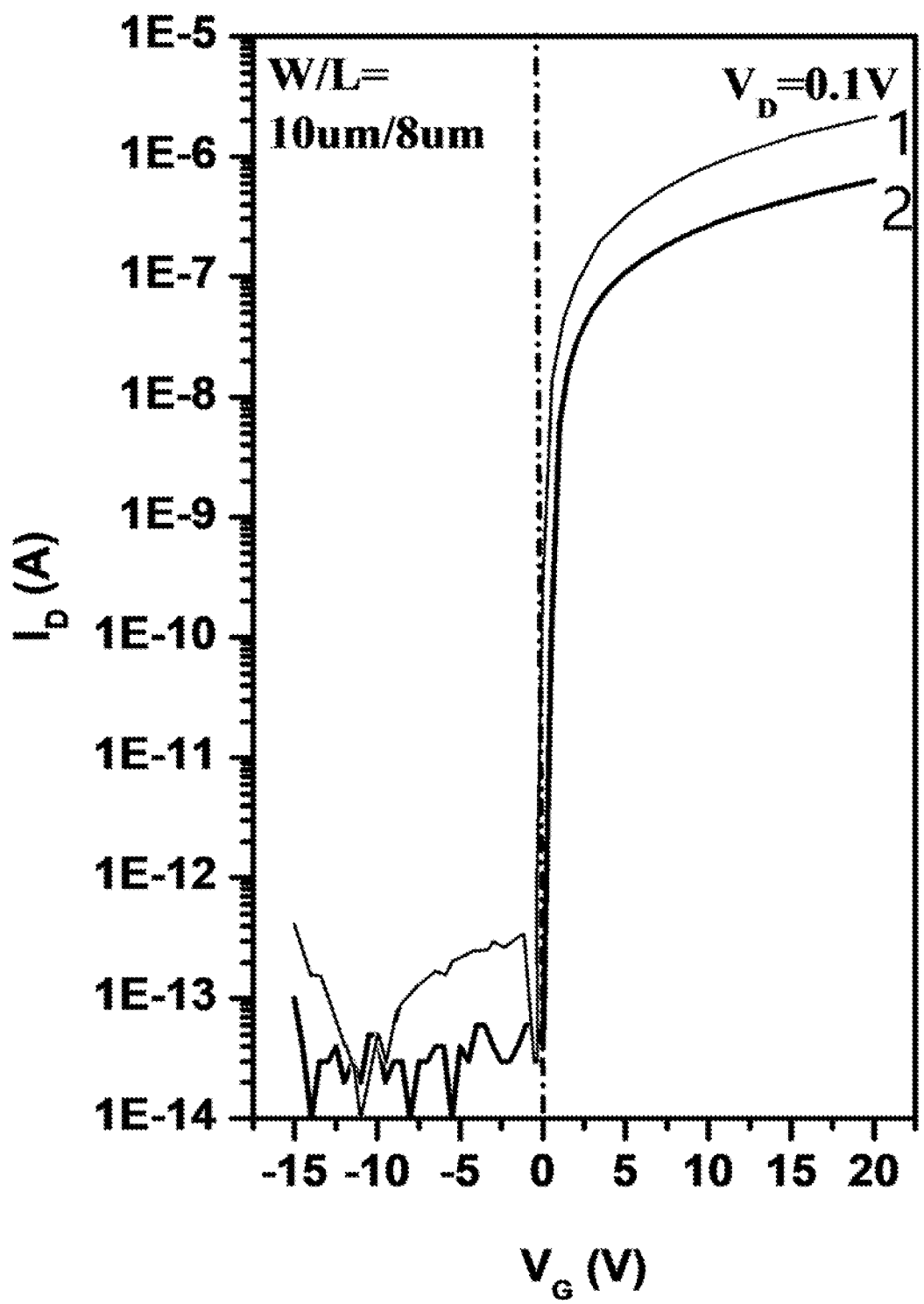
FIG. 5 is a schematic comparison diagram of a current-voltage curve of a thin film transistor provided by the embodiment of the present disclosure and a current-voltage curve of a thin film transistor provided in the prior art.

Shown in FIG. 5 is a schematic comparison diagram of a current-voltage curve of a thin film transistor provided by the embodiment of the present disclosure and a current-voltage curve of a thin film transistor provided in the prior art. In FIG. 5, $I_D(A)$ indicates that the ordinate is a drain current, and the unit is ampere. The scale value on the ordinate indicates that a magnitude of the current value is n-th root of 10, for example, 1E−14 indicates that the magnitude of the current value is $10^{-14}$. $V_G(V)$ indicates that the abscissa is a gate voltage, and the unit is volt. W/L=10 μm/8 μm indicates that a channel width of the transistor is 8 μm and a length of the transistor is 10 μm, and $V_D$=0.1V indicates that a drain voltage at a point corresponding to a dotted line is 0.1V. A curve 1 is a current-voltage curve of the thin film transistor according to the embodiment of the present disclosure, and a curve 2 is a current-voltage curve of the thin film transistor in the prior art. It can be known from the figure that when the drain voltages are all 0.1V, the drain current of the thin film transistor of the present disclosure is greater than the drain voltage of the prior art, that is, the array substrate provided by the embodiment of the present disclosure improves the electrical performance of the array substrate.

It can be known from the above embodiments:

The embodiments of the present disclosure provide the array substrate and the manufacturing method thereof, and the display panel. The array substrate comprises the substrate, the buffer layer, the active layer, the functional layer, the gate insulating layer, the gate layer, the interlayer insulating layer, the source/drain layer, the passivation layer, and the pixel electrode layer. The buffer layer is disposed at one side of the substrate, the active layer is disposed on the buffer layer in a direction that is away from the substrate, the functional layer is disposed on the active layer in a direction that is away from the buffer layer, the gate insulating layer is disposed on the functional layer in a direction that is away from the active layer, the gate layer is disposed on the gate insulating layer in a direction that is away from the functional layer, the interlayer insulating layer is disposed on the gate layer in a direction that is away from the gate insulating layer, the source/drain layer is disposed on the interlayer insulating layer in a direction that is away from the gate layer, the passivation layer is disposed on the source/drain layer in a direction that is away from the interlayer insulating layer, and the pixel electrode layer is disposed on the passivation layer in a direction that is away from the source/drain layer, wherein a first through-hole is formed on the interlayer insulating layer, the source/drain layer is connected to the functional layer through the first through-hole, and the functional layer is used for conducting the source/drain layer and the active layer. The functional layer is disposed between the active layer and the gate insulating layer, so that when the active layer is etched, the active layer is protected without damaging the surface of the active layer, thereby preventing the active layer from damage, and the functional layer may conduct the source/drain layer and the active layer, so that the transistors in the array substrate work normally, solving the technical problem that current display panels damage the active layer during the preparation process, which causes the performance of thin film transistors to decrease.

It can be understood that for those of ordinary skill in the art, equivalent replacements or changes can be made according to the technical solutions of the present disclosure and its inventive concept, and all these changes or replacements should fall within the protection scope of the claims attached to the present disclosure.

What is claimed is:

1. An array substrate, comprising:
a substrate;
a buffer layer disposed on one side of the substrate;
an active layer disposed on the buffer layer and away from the substrate;
a functional layer disposed on the active layer and away from the buffer layer;
a gate insulating layer disposed on the functional layer and away from the active layer;
a gate layer disposed on the gate insulating layer and away from the functional layer;
an interlayer insulating layer disposed on the gate layer and away from the gate insulating layer;
a source/drain layer disposed on the interlayer insulating layer and away from the gate layer;
a passivation layer disposed on the source/drain layer and away from the interlayer insulating layer;
a pixel electrode layer disposed on the passivation layer and away from the source/drain layer; and
a light-shielding layer disposed between the substrate and the buffer layer;
wherein a first through-hole is formed on the interlayer insulating layer, the source/drain layer is connected to the functional layer through the first through-hole, and the functional layer is used for conducting the source/drain layer and the active layer; and
a second through-hole is formed on the interlayer insulating layer, a third through-hole is formed on the buffer layer, and the source/drain layer is connected to the light-shielding layer through the second through-hole and the third through-hole.

2. The array substrate as claimed in claim 1, wherein a projection area of the functional layer on the substrate is equal to or less than a projection area of the active layer on the substrate.

3. The array substrate as claimed in claim 1, wherein a material of the active layer comprises one of indium gallium zinc oxide, indium gallium zinc tin oxide, zinc tin oxide, or indium zinc oxide.

4. The array substrate as claimed in claim 3, wherein a material of the functional layer comprises a metal oxide, and the metal oxide comprises at least one of indium gallium tin oxide, indium tin oxide, or indium zinc oxide.

5. The array substrate as claimed in claim 4, wherein a thickness of the functional layer ranges from 50 Å to 100 Å.

6. A manufacturing method of an array substrate, comprising:
providing a substrate;
forming a light-shielding layer on the substrate, and etching the light-shielding layer to form a light-shielding pattern;
forming a buffer layer on the light-shielding layer;
forming an active layer on the buffer layer;
forming a functional layer on the active layer;
etching the active layer and the functional layer to form an active layer pattern and a functional layer pattern;
forming a gate insulating layer on the functional layer, and etching the gate insulating layer to form a gate insulating layer pattern;
forming a gate layer on the gate insulating layer, and etching the gate layer to form a gate layer pattern;
forming an interlayer insulating layer on the gate layer, digging the interlayer insulating layer to form a first through-hole and a second through-hole, and digging the buffer layer to form a third through-hole;
forming a source/drain layer on the interlayer insulating layer, and etching the source/drain layer to form a source/drain layer pattern, wherein the source/drain layer is connected to the functional layer through the first through-hole, the functional layer is used for conducting the source/drain layer and the active layer, and the source/drain layer is connected to the light-shielding layer through the second through-hole and the third through-hole;
forming a passivation layer on the source/drain layer, and etching the passivation layer to form a passivation layer pattern; and
forming a pixel electrode layer on the passivation layer, and etching the pixel electrode layer to form a pixel electrode layer pattern.

7. The manufacturing method of the array substrate as claimed in claim 6, wherein the step of forming the functional layer on the active layer comprises:
depositing a metal oxide on the active layer by physical vapor deposition to form the functional layer, and controlling an argon/oxygen ratio in a gas to range from 2 to 4.

8. The manufacturing method of the array substrate as claimed in claim 6, wherein the step of etching the active layer and the functional layer to form the active layer pattern and the functional layer pattern comprises:
simultaneously etching the active layer and the functional layer by a photolithography process to form the active layer pattern and the functional layer pattern.

9. A display panel, comprising an array substrate, wherein the array substrate comprises:
a substrate;
a buffer layer disposed on one side of the substrate;
an active layer disposed on the buffer layer and away from the substrate;
a functional layer disposed on the active layer and away from the buffer layer;
a gate insulating layer disposed on the functional layer and away from the active layer;
a gate layer disposed on the gate insulating layer and away from the functional layer;
an interlayer insulating layer disposed on the gate layer and away from the gate insulating layer;
a source/drain layer disposed on the interlayer insulating layer and away from the gate layer;
a passivation layer disposed on the source/drain layer and away from the interlayer insulating layer;

a pixel electrode layer disposed on the passivation layer and away from the source/drain layer; and a light-shielding layer disposed between the substrate and the buffer layer;

wherein a first through-hole is formed on the interlayer insulating layer, the source/drain layer is connected to the functional layer through the first through-hole, and the functional layer is used for conducting the source/drain layer and the active layer; and a second through-hole is formed on the interlayer insulating layer, a third through-hole is formed on the buffer layer, and the source/drain layer is connected to the light-shielding layer through the second through-hole and the third through-hole.

10. The display panel as claimed in claim 9, wherein the display panel comprises an organic light-emitting diode (OLED) display panel, and the OLED display panel comprises a pixel definition layer, a light-emitting layer, a common electrode, and an encapsulation layer.

11. The display panel as claimed in claim 9, wherein a projection area of the functional layer on the substrate is equal to or less than a projection area of the active layer on the substrate.

12. The display panel as claimed in claim 9, wherein a material of the active layer comprises one of indium gallium zinc oxide, indium gallium zinc tin oxide, zinc tin oxide, or indium zinc oxide.

13. The display panel as claimed in claim 12, wherein a material of the functional layer comprises a metal oxide, and the metal oxide comprises at least one of indium gallium tin oxide, indium tin oxide, or indium zinc oxide.

14. The display panel as claimed in claim 13, wherein a thickness of the functional layer ranges from 50 Å to 100 Å.

* * * * *